Jan. 28, 1969 J. W. MAYER ET AL 3,424,910
SWITCHING CIRCUIT USING A TWO-CARRIER
NEGATIVE RESISTANCE DEVICE
Filed April 19, 1965

INVENTORS.
JAMES W. MAYER,
ROBERT E. BARON,
OGDEN J. MARSH,
BY
Charles S. Haughey
their ATTORNEY.

3,424,910
Patented Jan. 28, 1969

3,424,910

SWITCHING CIRCUIT USING A TWO-CARRIER NEGATIVE RESISTANCE DEVICE

James W. Mayer, Pacific Palisades, Ogden J. Marsh, Woodland Hills, and Robert E. Baron, Los Angeles, Calif., assignors to Hughes Aircraft Company, Culver City, Calif., a corporation of Delaware Filed Apr. 19, 1965, Ser. No. 448,973
U.S. Cl. 250—211 12 Claims
Int. Cl. H01j 39/12

ABSTRACT OF THE DISCLOSURE

Switching a two-carrier semiconductive device, having in the I region a deep recombination center dopant and a relatively lower concentration of shallow dopant of either p-type or n-type, under forward bias, from one stable state to a second stable state, especially by low-energy photon radiation, and also means for reversably switching from one stable state to the other and the reverse, by low or high energy photons or by an intermediate floating, injecting contact.

This invention relates to a switching circuit utilizing a double injection, two carrier semiconductor device in forward bias with two stable conductivity states separated by a negative resistance region, and more particularly to the switching of such a device from the low conductivity state to the high conductivity state by light of one wavelength, and from the high conductivity state to the low conductivity state by light of a different wavelength, or between these two conductivity states by suitably biasing a control contact on the device.

Alternatively, switching may be done through a third injecting contact to said I region by either biasing it with respect to one of the first mentioned injecting contacts, or by shorting the same as will appear.

It is proposed to use a semiconductor material having an I region, where the I region is lightly doped with a shallow level dopant of either p-type material ($\pi$-type) or n-type material ($\nu$-type) and the I region also contains a deep recombination center impurity, such as gold or copper for silicon or germanium type material, in a concentration greater than that of the shallow level dopant. The deep recombination center dopant concentration should exceed that of all other electrically active impurities in the I region, as will become apparent.

As used herein, semiconductor materials are materials, other than metals, which by suitable doping may be induced to carry substantial current under suitable bias, and include materials generally referred to as semiconductors, semi-insulators, and the like.

"Double Injection In Insulators" by Murray A. Lampert, Physical Review, volume 125, No. 1, Jan. 1, 1962, discusses double injection and the negative resistance characteristic utilized by this invention, and terms and theory hereof generally are analogous to or correspond to that of Lampert. The effects of a magnetic field on such devices are discussed by I. Melngailis and R. H. Rediker, I.R.E. Proceedings, 50, 248 (December 1962).

For further consideration of what we consider to be novel and our invention, attention is directed to the balance of this specification, the claims, and the drawings, in which:

FIG. 1 schematically illustrates a circuit according to this invention;

Figure 2:
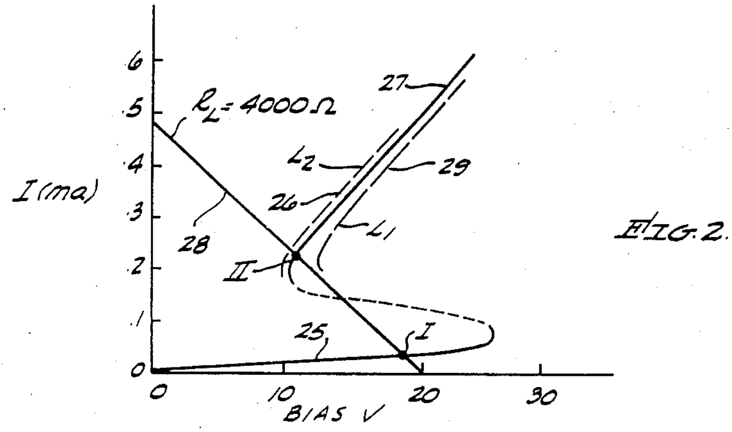
FIG. 2 is an I–V diagram with a negative resistance curve used to explain the theory of this circuit.

A key feature of this invention is the utilization of the negative resistance which arises from changes of population of recombination centers. Such changes are normally produced by injection of carriers under forward bias into the I region of a semiconductor device from contacts, which may be diffused $n^+$ and $p^+$ regions. By exposing the I region to light radiation whose photon energy $h\nu$ is less than band gap energy, but higher than the difference between band gap energy and recombination center energy, $Ec-Ed$ for donor recombination centers, the device may be switched "off" from a higher stable conductivity state to a lower stable conductivity state; similarly, the device may be switched "on" from the low stable conductivity state to the high stable conductivity state.

By way of example, a semiconductor material contains, in an I region, a set $N_D$ of deep donor ($\sigma_n << \sigma_p$) levels which lie in the lower half of the energy band gap and a set $N_A$ of shallow acceptor levels which partly compensate the donor levels ($N_D > N_A$). The quantities $\sigma_n$ and $\sigma_p$ are electron and hole capture cross-sections for the donor states. The semiconductor I region is p-type because the holes on the donor states a smaller ionization energy than the electrons on the donor states. At sufficiently low temperatures, the donor states are occupied by $p_D \approx N_A$ holes and $n_D \approx (N_D - N_A)$ electrons in thermal equilibrium and current is carried by the small number of holes $p_T$ thermally present in the valence band ($p_T << N_A$). As the rate of carrier injection is increased, the donor states, which act as recombination centers, fill with electrons and the device has a $J \alpha V^2$ behavior once the filling with electrons is complete.

Consider now the effect of incident radiation on the I region under forward bias. With a photon energy $h\nu$, of $E_c - E_D \leqq h\nu < E_g$, or low energy photons, the radiation can excite electrons from the donor states to the conduction band. Since the number of electrons on the donor levels $n_D$ may equal the number of the donor set $N_D$, substantial radiation of this low energy light will produce a substantial, and unusual, photoeffect, through interaction of the light with the double injection recombination. The low energy light increases $p_D$ by excitation of electrons to the conduction band, reducing the electron lifetime, $\tau n$, which in turn decreases the current. The emptying of electrons from the donor levels by the low energy light competes with the recombination of injected carriers, which tries to fill these centers. The effect will be strongest near the voltage minimum (the lowest voltage at which the high level state can be obtained) and in fact will raise the value of the voltage minimum V min. By proper selection of the circuit load line, such low energy light radiation can move the knee of the negative resistance curve beyond the load line and thus switch the I region to the low level current, or switch to the "off" state.

If light of photon energy, higher than band gap, $h\nu_2 > Eg$, or high energy light, illuminates the I region, such radiation generates hole-electron pairs across the band gap. This process dominates because of its much higher photon absorption cross section. This generation of hole-electron pairs simply adds to the injected carriers, leading to a normal photoconductive effect which will become relatively smaller as the injection level increases from V min. In contrast to the low-energy light radiation, V min. can only be lowered since the photo generation now aids rather than hinders the injected carriers in maintaining the recombination centers filled with electrons. High energy radiation can thus augment double injection, and thus switch to the low resistivity state, or the "on" state, even in the presence of the low energy light radiation; but low energy light can only switch the device to the "off" state in the absence of substantial high energy light.

Figure 1:
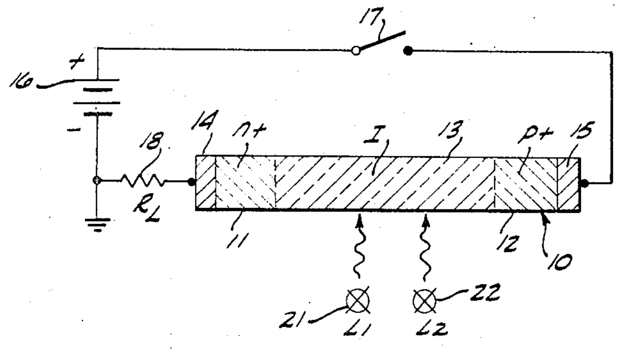

As illustrated in FIG. 1, a semiconductor device 10

(which may be of silicon, germanium, cadmium telluride, gallium arsenide, cadmium selenide, indium antimonide, or other material capable of double injection, two carrier operation) comprises an I region 13, and injecting contact regions of $p^+$ and $n^+$ 12 and 11, respectively, to which ohmic contacts 15 and 14 are made. A bias circuit comprising a battery 16, a switch 17 and a load resistor 18($R_L$) is provided to forward bias the semiconductor device upon closing of the switch 17.

A pair of low energy and high energy light radiation sources 21 and 22 are provided for supplying low energy or high energy photons to the I region of the semiconductor device 10. When the device is first energized, without light radiation, by closing switch 17, the dark current will follow the dark current curve 25 of FIG. 2, and with the load resistor $R_L = 4000\Omega$ illustrated, the device operates at position I, the high resistivity state, or "off" position.

Upon illumination of the I region 13 of the semiconductor device 10 with high energy light $L_2$ from source 22, the device switches to the low resistivity "on" state on the $L_2$ light current curve 26, and as the $L_2$ light source turns off the device moves to position II on the dark current curve 27, the normal "on" position.

When the low energy light source $L_1$ is turned on, the load line 28 for $R_L$ passes by the knee of the current controlled negative resistance curve 29, and returns to state I, the "off" position.

Figure 3:
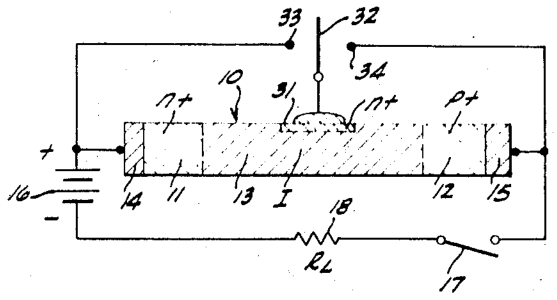
FIG. 3 is an alternate switching circuit.
Figure 4:
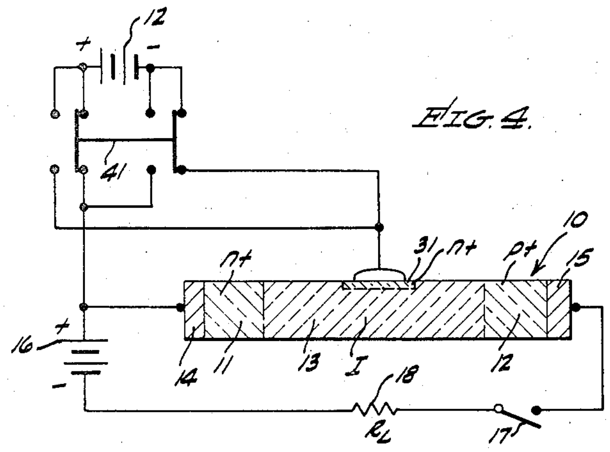
FIG. 4 is another alternate switching circuit.

The device of FIG. 1 may be similarly operated from an auxiliary injecting contact, as shown in alternate FIGS. 3 and 4.

In FIG. 3, the device 10 is provided with a bias circuit comprising the battery 16 and the load resistance $R_L$, 18, between the contacts 14 and 15, and as the switch 17 closes the circuit, the device operates in the "off" state. An injecting contact 31, in this example of $N^+$ type conductivity, is connected through a shorting switch 32 to the contacts 14 and 15. By closing the shorting switch 31 in the forward circuit contact 33, additional carriers are injected into the I region, causing it to move on the load line of FIG. 2 to the "on" state of position II, where it remains stable upon breaking the shorting circuit contact. Down-switching is accomplished by shorting to the reverse bias side contact 34, returning the device to the "off" state I.

As illustrated in FIG. 4, an auxiliary bias circuit may be provided which is less sensitive, and thus more versatile, than the shorting switch circuit of FIG. 3. In this case the injecting contact 31 is connected through reversing switch 41 to a second bias source, battery 42. With the bias switch 17 closed, and the reversing switch 41 in the reverse position, the device circuit will operate in the "off" state I of FIG. 2. When the reversing switch 41 is moved to the forward bias position as shown, the device switches "on," and moves to substantially position II in FIG. 2. Reversing the switch 41 to the reverse bias position will turn the device "off" again.

As explained, this invention is especially adapted to utilize low energy light radiation to switch the circuit from "on" to "off" and may also utilize an auxiliary injecting contact for the purpose.

What we claim is:

1. In a circuit comprising a semiconductor device having an I region and a pair of p and n types of injecting contacts thereto, under forward bias, the method of switching the device from a stable high conductivity state to a stable low conductivity state by exposing said I region to radiation.

2. The method according to claim 1 wherein said radiation is of light whose photon energy ($h\nu_1$) is less than the semiconductor material band gap energy ($E_c - E_v$) and greater than the difference between the conduction band energy and the recombination center energy ($E_c - E_D$).

3. The method according to claim 1 wherein said I region contains a deep recombination level impurity of one type and a shallow recombination level impurity of opposite type in less concentration than that of the deep recombination level impurity.

4. The method according to claim 3 wherein the deep recombination level impurity is of the class consisting of gold and copper.

5. The method according to claim 1 wherein said I region contains a deep recombination level impurity of n-type and a shallow recombination level impurity of p-type in less concentration than that of the deep recombination level impurity.

6. In a circuit comprising a semiconductor device having an I region with a low concentration of shallow level p- or n-type dopant and a relatively higher concentration of deep recombination center dopant and a pair of p- and n-types of injecting contacts thereto, and having a stable low conductivity state and a stable high conductivity state, under forward bias, the method of switching the device from a stable low conductivity state to a stable high conductivity state by exposing said I region to externally generated light radiation, whose photon energy is higher than band gap energy whereby electron-hole pairs are generated within the I region and supplement the injected carriers sufficiently to switch to the stable high conductivity state, and the device will continue to operate in the stable high conductivity state independently of said radiation.

7. A switching circuit comprising: a semiconductor device having an I region with a low concentration of shallow level p-type or n-type dopant and a relatively higher concentration of deep recombination center dopant, and a pair of injecting p- and n-types of contacts thereto, and having, under forward bias, a stable high conductivity state and a stable low conductivity state separated by a negative resistance region; bias means for forward biasing said device; and switching means for reducing the carrier population of the I region sufficiently to switch said device from the high to the low conductivity state, whereby the device will continue to operate in the stable low conductivity state independently of said switching means.

8. A switching circuit according to claim 7 wherein said switching means comprises a third normally unbiased injecting contact to said I region between said pair of injecting contacts and circuit means for shorting said I region contact to one of said first mentioned injecting contacts.

9. A switching circuit comprising: a semiconductor device having an I region and a pair of injecting p- and n-types of contacts thereto, which device, has under forward bias, a stable high conductivity state and a stable low conductivity state separated by a negative resistance region; bias means for forward biasing said device; and means for switching said device from the high to the low conductivity state comprising a light radiation source for light whose photon energy ($h\nu_1$) is less than the semiconductor material band gap ($E_C - E_V$) and greater than the difference between the conduction band energy and the recombination center energy ($E_C E_D$).

10. A switching circuit comprising: a semiconductor device having an I region and a pair of injecting p- and n-types of contacts thereto, which device has, under fixed forward bias, a stable high conductivity state and a stable low conductivity state separated by a negative resistance region; bias means for forward biasing said device; first means for switching said device from the high to the low conductivity state without changing said bias; and second means for switching said device from the low to the high conductivity state without changing said bias.

11. A switching circuit according to claim 10 wherein said switching means comprises a third injecting contact to said I region and circuit means for shorting said I region contact alternatively to one or the other of said first mentioned injecting contacts.

12. A switching circuit comprising: a semiconductor device having an I region and a pair of injecting p- and n-types of contacts thereto, which device has, under forward bias, a stable high conductivity state and a stable low conductivity state separated by a negative resistance region; bias means for forward biasing said device; first means for switching said device from the high to the low conductivity state, a light radiation source for light whose photon energy ($h\nu_1$) is less than the semiconductor material band gap ($E_C—E_V$) and greater than the difference between the conduction band energy and the recombination center energy ($E_C—E_D$); and second means comprising a light radiation source whose photon energy ($h\nu_2$) is greater than band gap ($E_C—E_V$) for switching said device from the low to the high conductivity state.

References Cited

UNITED STATES PATENTS

| | | | |
|---|---|---|---|
| 2,863,056 | 12/1958 | Pankove | 250—211 |
| 2,986,591 | 5/1961 | Swanson et al. | 250—211 |
| 3,081,404 | 3/1963 | Memelink | 317—235 |
| 3,158,754 | 11/1964 | Yu | 317—235 |
| 3,158,760 | 11/1964 | Taylor | 317—235 |
| 3,249,764 | 5/1966 | Holonyak | 307—88.5 |
| 3,304,430 | 2/1967 | Baird et al. | 250—211 |
| 3,324,297 | 6/1967 | Stieltjes et al. | 250—211 |
| 3,358,146 | 12/1967 | Ing et al. | 317—235 |

RALPH G. NILSON, *Primary Examiner.*

M. A. LEAVITT, *Assistant Examiner.*

U.S. Cl. X.R.

307—311; 317—235